(12) United States Patent
Cravens et al.

(10) Patent No.: US 8,766,475 B2
(45) Date of Patent: Jul. 1, 2014

(54) SYSTEM AND METHOD FOR A REDUNDANT AND KEYED POWER SOLUTION

(75) Inventors: Zachary A. Cravens, Round Rock, TX (US); Jason M. Lau, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 704 days.

(21) Appl. No.: 13/020,274

(22) Filed: Feb. 3, 2011

(65) Prior Publication Data

US 2012/0200154 A1 Aug. 9, 2012

(51) Int. Cl.
*H02J 1/10* (2006.01)
(52) U.S. Cl.
USPC ............................................................ 307/43
(58) Field of Classification Search
USPC .......................................... 307/43; 439/210
See application file for complete search history.

(56) References Cited

U.S. PATENT DOCUMENTS

| | | | | |
|---|---|---|---|---|
| 4,382,156 | A * | 5/1983 | Jodoin | 174/72 B |
| 6,153,946 | A | 11/2000 | Koch et al. | 307/64 |
| 6,649,686 | B1 * | 11/2003 | Peters | 524/503 |
| 6,649,886 | B1 * | 11/2003 | Kleshchik | 219/529 |
| 6,967,283 | B2 * | 11/2005 | Rasmussen et al. | 174/50 |
| 7,252,524 | B1 * | 8/2007 | Johnson et al. | 439/210 |

OTHER PUBLICATIONS

International Search Report and Written Opinion; Application No. PCT/US2012/022927; pp. 11, Sep. 27, 2012.
International Preliminary Report on Patentability; PCT/ US2012/ 022927; pp. 8; Date of Mailing: Aug. 15, 2013.
http://www.ttiinc.com/object/fp_panduit_panlug.html, TTI, Inc. website (accessed Jan. 7, 2014), 1 page.
http://www.methode.com/power/bus-bars.html, Methode Electronics, Inc. website (accessed Jan. 7, 2014), 2 pages.

* cited by examiner

*Primary Examiner* — Rexford Barnie
*Assistant Examiner* — Joseph Inge
(74) *Attorney, Agent, or Firm* — Baker Botts L.L.P.

(57) ABSTRACT

In accordance with the present disclosure, a system and method a power deliver system is presented. The power delivery system includes at least two power supplies with a bridge connecting an output of each of the at least two power supplies. The bridge may be made of busbars, each of which including an integral attachment point. Each of the attachment points may correspond to a lug which has been specifically keyed to the shape of the attachment point. The lugs may be attached to conductor cables that provide power from the power supplies to components in an information handling system. In some embodiments, each end of a conductor cable may include lugs of the same shape, to ensure that the correct voltage is supplied to the components of the information handling system.

20 Claims, 4 Drawing Sheets

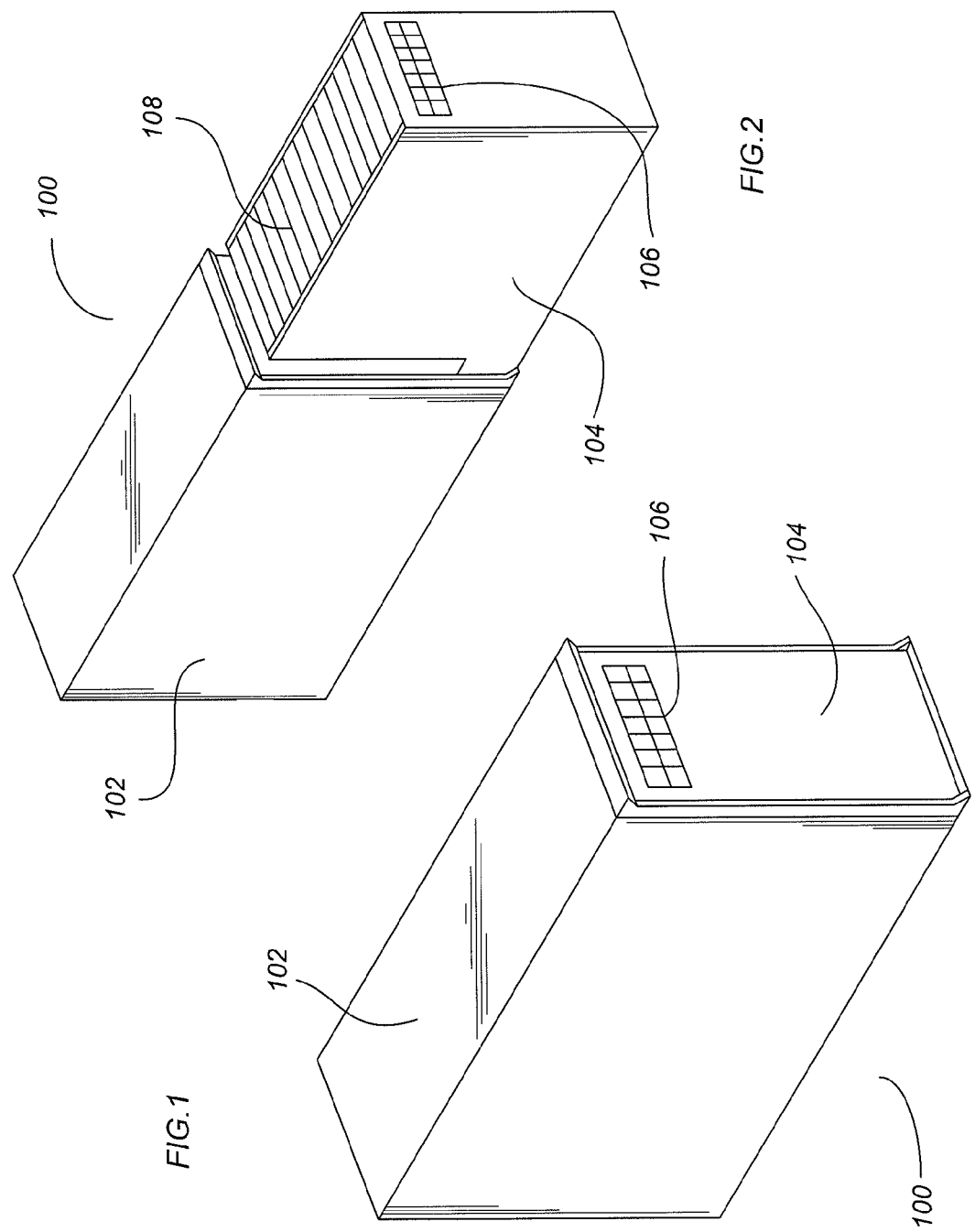

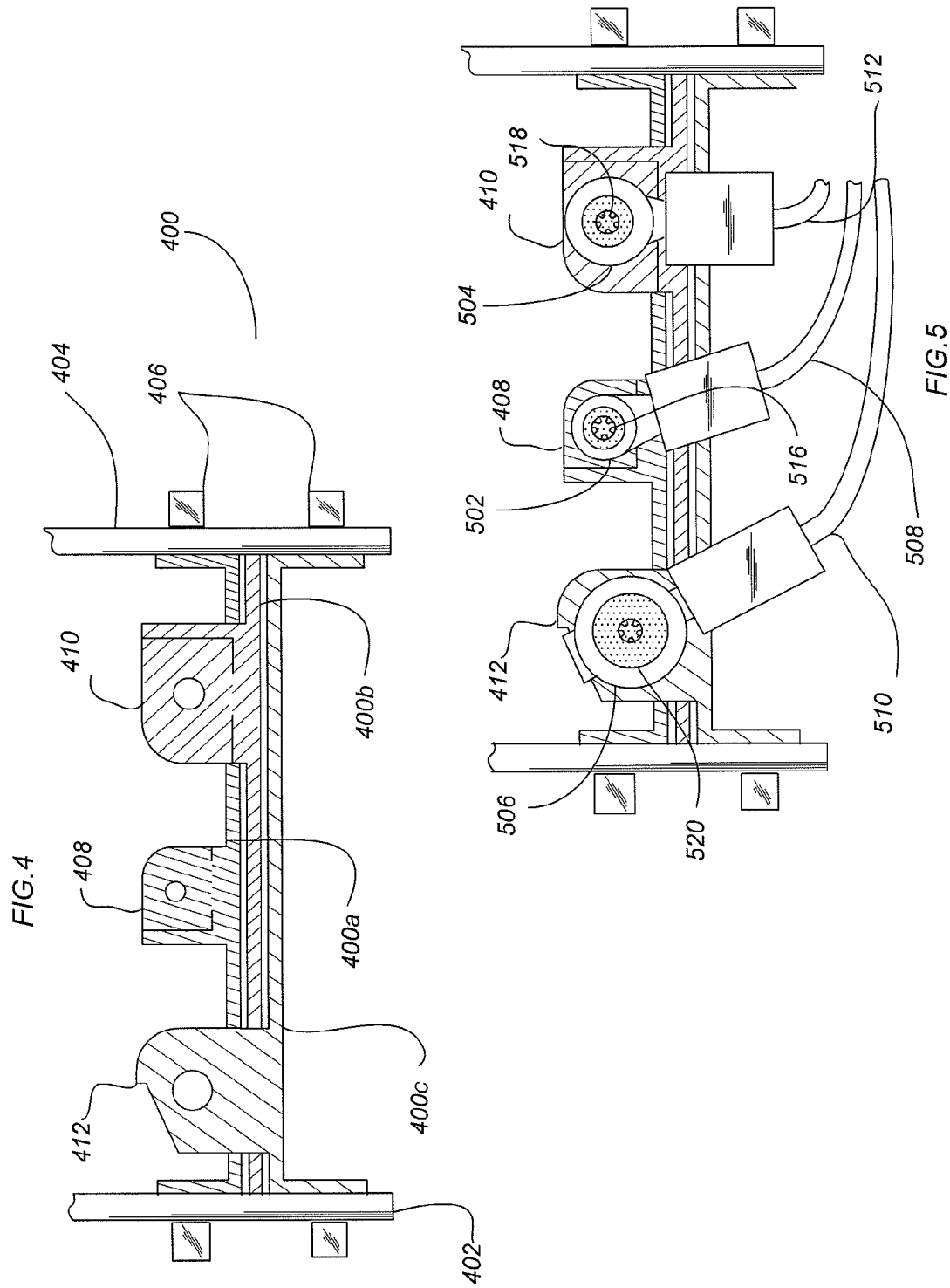

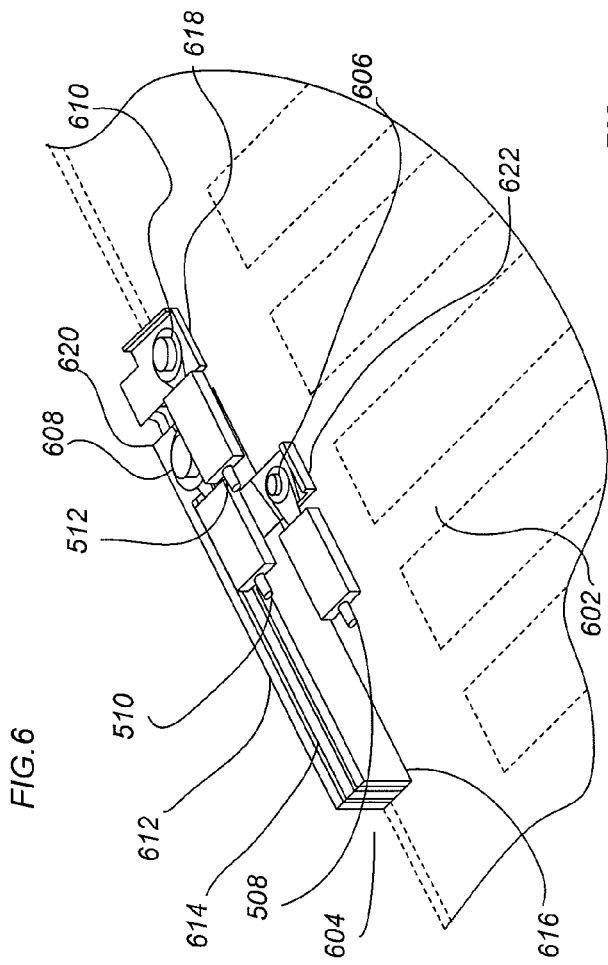

SYSTEM AND METHOD FOR A REDUNDANT AND KEYED POWER SOLUTION

TECHNICAL FIELD

The present disclosure relates generally to the operation of computer systems and information handling systems, and, more particularly, to a system and method for a Redundant and Keyed Power Solution.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking system.

Some information handling systems require large amount of storage, and storage blades may be used to provide the necessary storage capacity. Storage blades typically incorporate numerous storage devices, such as hard drives, in a scalable system. Each of the storage blades and the hard drives incorporated within the storage blades require power to operate. In some instances, components of the storage blade may require different voltage levels. Providing multiple voltage connections, however, is problematic because supplying a component to the wrong voltage can cause irreparable damage. In addition, redundancy of power supplies is a concern, as data can be lost from storage devices if the power is lost. Each of the storage blades and the storage devices within the storage blades also generate heat, which must be circulated away from the components to avoid damage. One problem with storage blades is providing the necessary redundant voltage levels without impeding thermal circulation. This problem is particularly challenging when the storage blade incorporates translating elements into its structure.

SUMMARY

In accordance with the present disclosure, a system and method for power delivery is presented. The power delivery system includes at least two power supplies with a bridge connecting an output of each of the at least two power supplies. The bridge may be a first busbar assembly that includes integral attachment points. Each of the attachment points may correspond to a lug which has been specifically keyed to the shape of the attachment point. The lugs may be attached to conductor cables that provide power from the power supplies to components in an information handling system. In some embodiments, the components may be electrically coupled to a second busbar assembly that also includes integral attachment points. The conductor cables may attach to the attachment points of the second busbar assembly using lugs similar to those attached to the busbar bridge on the power supplies.

The system and method disclosed herein is technically advantageous because it provides keyed and redundant power while not sacrificing thermal circulation. The use of keyed lugs ensures the cabling is attached correctly, thereby preventing the application of the incorrect voltage to system components. The use of busbars reduces the amount of wiring required to provide power to system components, saving space for air to efficiently circulate. Additionally, the use of multiple power supplies connected by a bridge ensures power will be available to vital system elements even if one of the power supplies fails. Other advantages will be apparent to one of ordinary skill in the art.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is an example device incorporating aspects of the present invention.

FIG. 2 is the example device of FIG. 1 with an extended translating element.

FIG. 4 is an example busbar assembly with keyed attachment points according to aspects of the present invention.

FIG. 5 is the example busbar assembly of FIG. 4 including attached keyed lugs, according to aspects of the present invention FIG. 6 is a power connection of a translating element according to aspects of the present invention.

FIG. 7 illustrates the airflow through a device incorporating aspects of the present invention.

DETAILED DESCRIPTION

Figure 3:
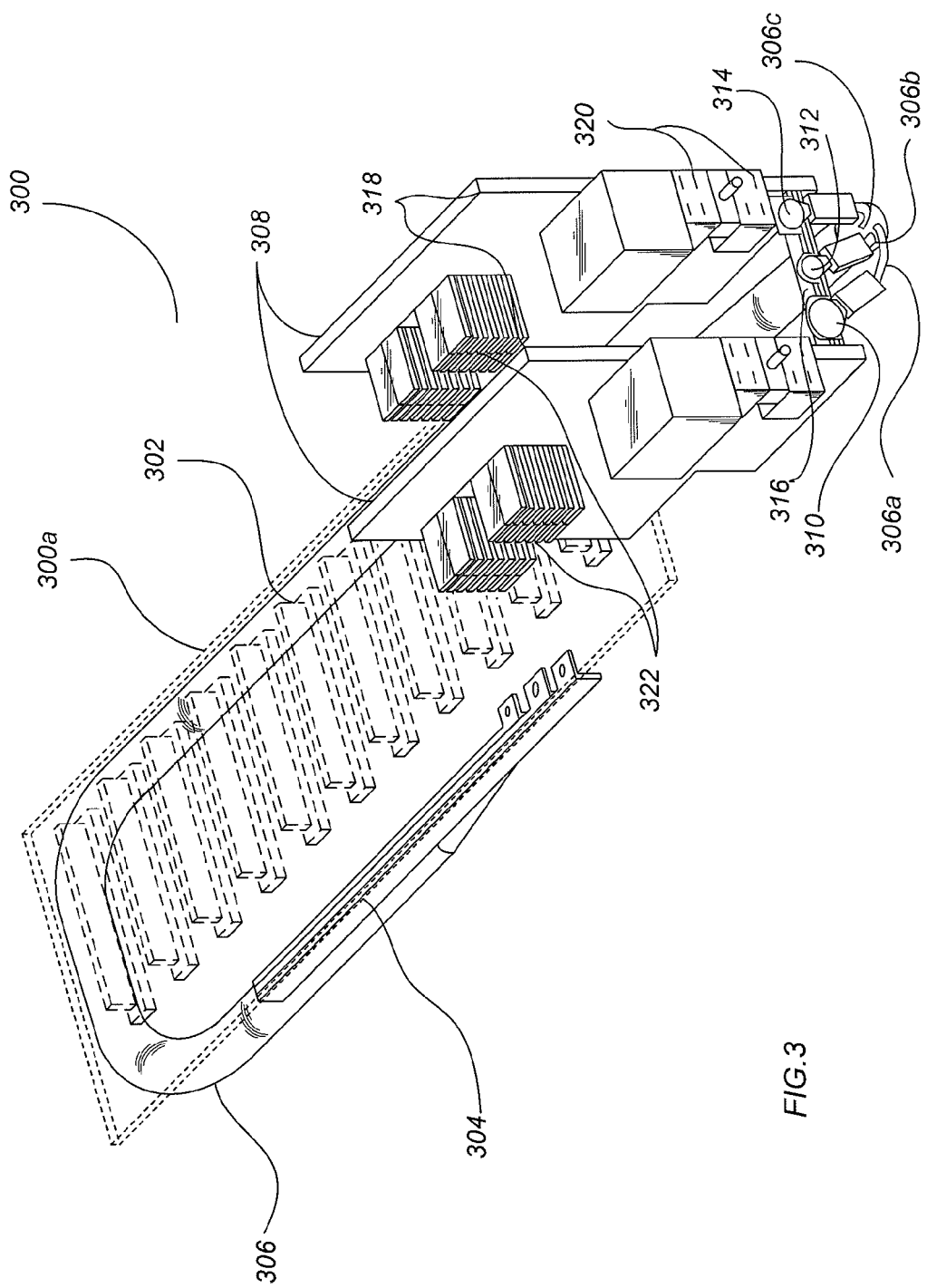
FIG. 3 is an example device incorporating aspects of the present invention with an external chassis removed.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

The present application is directed to a redundant and keyed power solution for a storage device. FIGS. 1 and 2 show one example of a storage device, storage blade 100. The storage blade 100 includes an outer chassis 102 and a translating structure. The translating structure is drawer 104, which accepts numerous hard disk drives 108, positioned vertically within the drawer. The drawer 104 translates outwardly from the interior of storage blade 100, exposing the top of the hard disk drives 104, as shown in FIG. 2. The storage blade 100 further includes airflow vents 106 to allow airflow through the storage blade 100. Each of the hard disk drives 104 require power to operate, both when the drawer is open and closed. Other translating structures and configurations are possible, including a drawer which positions hard drives horizontally; the example storage blade 100 shown in FIGS. 1 and 2 should not be seen as limiting.

FIG. 3 shows a rear view of a storage blade 300, which is similar to the storage blade 100 of FIGS. 1 and 2, without an exterior chassis or hard drives. The drawer includes a base 300a, which is transparent to facilitate the view of power distribution elements. At least one electronic component, connector 302, is disposed on base 300a. The connectors 302 may be, for example, SAS or SCSI connectors. Each of the connectors 302 may connect and provide power to a hard drive. The connectors 302 receive power from power distribution elements, including busbar assembly 304 and power cable 306, to which each of the connectors 302 are electrically coupled. The busbar assembly 304 is connected to and receives power through power cable 306. The power cable 306 include three conductor cables 306a, 306b, 306c disposed within an outer insulation and may include a cross-sectional area normal to the airflow path through the storage blade, as will be discussed below. The conductor cables may be attached at one or both sides to keyed connectors, examples of which are keyed lugs 310, 312, and 314. In some embodiments, the keyed connectors may be attached to power distribution elements, such as busbar assembly 316 coupled to power sources 308.

Power sources 308 may be comprised of a printed wiring assembly (PWA) 318 and receives input power from a common source, such as a midplane of a blade server assembly. The power sources 308 may electrically connect with and receive power at a first voltage level from the midplane using plugs 320 or any other electrical connection device well known in the art. The first voltage level may be the voltage level common to the midplane, such as 12 V. The first voltage level may be applied, via the PWA 318, to different components and connections in the power sources 308. For example, each of the power sources 308 include a voltage regulator 322, and each voltage regulator 322 may receive as an input the first voltage level from the midplane and provide an output voltage at a second, predefined voltage level that may, for example, be a voltage level, such as 5 V, required to power hard drives. The output of each voltage regulator 322 may be coupled via PWA 318 through a bridge. In FIG. 3, the bridge is included at part of the busbar assembly 316.

FIG. 4 is a closeup of one example of a busbar assembly 400 incorporating a bridge according to aspects of the present invention. The bridge may, for example, be busbar 400a, which is one busbar of busbar assembly 400. In addition to electrically coupling the output voltages of power sources 402 and 404, the busbar assembly may further mechanically couple the power sources 402 and 404 together via bolts 406. Although a busbar is shown in FIGS. 3 and 4 coupling output voltages of the power sources, any conductive material well known in the art can be used. Providing two power sources with bridged output voltages is advantageous because it provides a redundant power source—if one of the voltage regulators fails, the other voltage regulator can still provide the required output voltage. This is particularly advantageous if the output voltage powers hard drives, which may lose data or reduce system efficiency if not powered.

As can be further seen in FIG. 4, busbar assembly 410 comprises three separate busbars 400a, 400b, and 400c, each separated from the adjacent busbar by an insulating layer. Each of the busbars 400a, 400b, and 400c may be at a different voltage potential. As previously mentioned, busbar 400a may acts as a bridge between the outputs of the voltage regulators and therefore may be at the voltage level output by the voltage regulators. Busbar 400b, on the other hand, may be at a voltage level higher than the voltage level of busbar 400a. In some embodiments, busbar 400b may be at the voltage level received from the midplane of the server system. The third busbar 400c, may act as a ground. Although three voltage potentials are shown in the example embodiment shown, many different voltage levels and connections may be used within the scope of this disclosure. Providing multiple voltage levels is advantageous, because components in the storage blade, including components on the translating structure may require different input voltages to work effectively.

Each of the busbars 400a, 400b, and 400c in FIG. 4 include integral attachment points 408, 410 and 412, respectively. Each of the attachment points 408, 410, and 412 may be integral with and made from the same material as the corresponding busbar and spaced apart across the busbar assembly 400 so as to avoid contacting adjacent busbars or attachment points. In a preferred embodiment, the attachment points 408, 410, and 412 are made of a rigid, conductive material, such as a metal plate, to prevent the attachment points from moving and shorting out against, for example, one of the other attachment points.

The attachment points 408, 410, and 412 include unique characteristics, such as bores which are each of a different diameter. The size and shape of each attachment point 408, 410, and 412 is also unique. For example, attachment point 412 includes a curved upper edge that includes a notch. Attachment point 408, in contrast, is smaller than the other attachment points and includes a raised edge with an angled notch on the front face of the attachment point that also includes a notch. Finally, attachment point 410 includes a beveled upper edge, a raised portion along its lower edge, and a notch out of the raised portion of a different size and orientation than the notch of attachment point 408. Each attachment point may correspond, or be keyed to, one and only one keyed connector, as will be discussed below. The above are merely example configurations of attachment points and numerous other configurations may be used within the scope of this disclosure.

FIG. 5 shows the attachment points 408, 410, and 412 of FIG. 4 attached to lugs 502, 504, and 506, respectively. Lugs 502, 504, and 506 are connected to conductor cables 508, 510, and 512, which may comprise a power cable such as power cable 306 shown in FIG. 3. As can be seen, each of the lugs 502, 504, and 506 is keyed to the shape and configuration of the attachment point to which it is attached. Lug 506 includes a hooked portion that corresponds with the notch in the upper edge of attachment point 412. Lug 502, on the other hand, is smaller than lug 506 and includes a size and shape that corresponds with the size of attachment point 408 and the notch in the raised portion of attachment point 408. Similarly, lug 504 is sized and shaped differently than lugs 502 and 506 but is shaped to fit within the notch on the raised edge of attachment point 410. Additionally, each of the screws 516, 518, and 520 are of different sizes so as to be keyed to one of the lug and attachment point combinations. Each lugs is keyed to only one attachment point, and vice versa.

The opposite end of conductor cables 508, 510, and 512 may also include keyed lugs, as shown in FIG. 6. FIG. 6 shows keyed lugs 606, 608, 610 attached to busbar assembly 604 on translating drawer 602. The view in FIG. 6 is of the underside of a translating drawer 602, similar to the drawer 300 of FIG. 3. Like the busbar assembly 316 of the power sources 308 of FIG. 3, busbar assembly 604 includes multiple busbars 612, 614, and 616, each separated by the adjacent busbar by an insulating layer. Also like the busbar assembly 316 of the power sources 308, each of the busbars 612, 614, and 616 of the busbar assembly include attachment points 618, 620, and 622 integral with the busbars. Some or all of the busbars 612, 614, and 616 are connected and supply power to components on the translating drawer 602.

Each of the lugs 606, 608, 610 are similar in shape, size, and configuration to corresponding lugs 502, 506, and 504, on the other side of conductor cables 508, 510, and 512, respectively. Including keyed lugs on each side of a conductor cable is advantageous because it ensures that the lugs on both sides of the conductor cable are installed correctly. If, for example, each of the components requiring an input voltage of 5 V are electrically coupled to busbar 616 of busbar assembly 604 on drawer 602, the same conductor cable must be connected to both attachment point 622 and the attachment point at the power source which provides the 5 V output. If each end of the conductor cable includes a lug that can only attach to the correct attachment plate and, therefore, the correct busbar, then the conductor cable cannot be installed incorrectly. Although the example lug configurations shown in FIGS. 5 and 6 include similar lugs on both sides of each conductor cable, the lugs on opposite sides of the same conductor cable are not required to be identical; they must, however, be keyed to only attach to the correct attachment point on both the busbar assembly of the translating structure and the correct attachment point at the power source.

Returning to FIG. 3, when drawer 300 is closed, the power cable 306 coils around the external edge of drawer 300. This is advantageous because the power cable 306 does not impede the airflow through the storage blade. FIG. 7 is a cross-section of a storage blade incorporating aspects of the present invention and shows the airflow through storage blade. As can be seen, drawer 701 is closed within chassis 700, abutting power sources 702, positioned at the back of the storage blade. Hard drives 703 are arranged vertically within the drawer 700 of the storage blade. Cool air is received through the front of the storage blade and proceeds along the top of hard drives 703. The air is pulled downward through each of the hard drives 703, cooling the hard drive. The heated air then escapes out the back of the storage blade, beneath the power supplies 702. Because the power cable is coiled around the external edge of drawer 700, as shown in FIG. 3, both the cool air intake and heated exhaust air are allowed to pass unimpeded by the cable.

Although the present disclosure has been described in detail, it should be understood that various changes, substitutions, and alterations can be made hereto without departing from the spirit and the scope of the invention as defined by the appended claims.

What is claimed is:

1. A power deliver system, comprising:
    at least two power supplies;
    a bridge connecting an output of each of the at least two power supplies, wherein the bridge includes at least a first and a second attachment point, wherein the bridge comprises a first busbar assembly, wherein the first busbar assembly comprises at least a first busbar and a second busbar, and wherein the first busbar and the second busbar are separated by a first insulating layer;
    a second busbar assembly coupled to a translating element, wherein the second busbar assembly comprises at least a third busbar and a fourth busbar separated by a second insulating layer, wherein the third busbar includes a third attachment point and the fourth busbar includes a fourth attachment point;
    a power cable, wherein the power cable includes at least first and a second conductor cable; and
    at least a first and a second lug, wherein the first lug is coupled to the first conductor cable and the second lug is coupled to the second conductor cable, and wherein the first lug is keyed to the first attachment point and the second lug is keyed to the second attachment point.

2. The power deliver system of claim 1, wherein the first attachment point is integral with the first busbar, the second attachment point is integral with the second busbar, and wherein the first busbar and the second busbar are at different voltage potentials.

3. The power deliver system of claim 1, wherein each of the first attachment point and the second attachment point includes a different diameter bore.

4. The power deliver system of claim 1, wherein each of the at least two power supplies includes a voltage regulator, and the bridge connects an output of each of the voltage regulators.

5. The power deliver system of claim 1, further comprising at least a third lug and a fourth lug, wherein the third lug is connected to the first conductor cable on an end opposite the first lug, and where the fourth lug is connected to the second conductor cable on an end opposite the second lug.

6. The power deliver system of claim 5, wherein the third lug is keyed to the third attachment point and the fourth lug is keyed to the fourth attachment point.

7. The power deliver system of claim 6, wherein the first lug is the same shape as the third lug and the second lug is the same shape as the fourth lug.

8. The power deliver system of claim 1, wherein the second busbar assembly powers a plurality of hard drives connected to the translating element.

9. A method for a redundant and keyed power system, comprising:
    providing at least two power supplies;
    providing a first busbar assembly connecting the output of the at least two power supplies, wherein the busbar assembly includes at least a first and a second attachment point;
    providing a second busbar assembly connected to a translating element;
    providing a power cable, wherein the power cable includes at least first and a second conductor cable; and
    providing at least a first and a second lug, wherein the first lug is coupled to the first conductor cable and the second lug is coupled to the second conductor cable, and wherein the first lug is keyed to the first attachment point and the second lug is keyed to the second attachment point.

10. The method for a redundant and keyed power system of claim 9, wherein the second busbar assembly connected to the translating element includes at least a third and a fourth attachment point.

11. The method for a redundant and keyed power system of claim 10, further comprising at least a third lug and a fourth lug, wherein the third lug is connected to the first conductor cable on an end opposite the first lug, and where the fourth lug is connected to the second conductor cable on an end opposite the second lug.

12. The method for a redundant and keyed power system of claim 11, wherein third lug is keyed to the third attachment point and the fourth lug is keyed to the fourth attachment point.

13. The method for a redundant and keyed power system of claim 9, wherein power cables includes a cross-sectional area normal to the airflow path through the translating element.

14. The method for a redundant and keyed power system of claim 9, wherein each of the at least two power supplies includes a voltage regulator and a printed wiring assembly.

15. The method for a redundant and keyed power system of claim 9, wherein the second busbar assembly connected to the translating element powers a plurality SAS and SCSI hard drives connected to the translating element.

16. A storage blade, comprising:
    at least two power supplies;
    a first busbar assembly attached to the at least two power supplies, wherein the first busbar assembly includes at least a first and a second attachment point;
    a translating drawer, wherein the translating drawer includes a plurality of hard drives;
    a second busbar assembly connected to the translating drawer, wherein the second busbar assembly includes at least a third and a fourth attachment point, and wherein the second busbar assembly is electrically coupled to the plurality of hard drives;
    a power cable, wherein the power cable includes at least a first and a second conductor cable;
    a first lug coupled to an end of the first conductor cable and keyed to the first attachment point;
    a second lug coupled to the second conductor cable and keyed to the second attachment point;
    a third lug coupled to an end of the first conductor cable opposite the first lug and keyed to the third attachment point; and
    a fourth lug coupled to an end of the second conductor cable opposite the second lug and keyed to the fourth attachment point.

17. The storage blade of claim 16, wherein the first lug is the same shape as the third lug and the second lug is the same shape as the fourth lug.

18. The storage blade of claim 16, wherein each of the first attachment point and the second attachment point includes a different diameter bore.

19. The storage blade of claim 16, wherein the second busbar assembly powers a plurality of hard drives connected to the translating drawer.

20. The storage blade of claim 16, wherein the first attachment point is integral with the first busbar assembly, the second attachment point is integral with the second busbar assembly, and wherein the first busbar assembly and the second busbar assembly are at different voltage potentials.

* * * * *